US010630516B2

(12) United States Patent
Feygin et al.

(10) Patent No.: US 10,630,516 B2
(45) Date of Patent: Apr. 21, 2020

(54) SYSTEM AND METHOD FOR PROVIDING FILTER/MIXER STRUCTURE FOR OFDM SIGNAL SEPARATION

(71) Applicant: Samsung Electronics Co., Ltd., Gyeonggi-do (KR)

(72) Inventors: Gennady Feygin, San Diego, CA (US); Pranav Dayal, San Diego, CA (US); Jungwon Lee, San Diego, CA (US)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/890,952

(22) Filed: Feb. 7, 2018

(65) Prior Publication Data
US 2019/0140877 A1 May 9, 2019

Related U.S. Application Data

(60) Provisional application No. 62/583,260, filed on Nov. 8, 2017.

(51) Int. Cl.
*H04L 27/26* (2006.01)
*H03H 17/02* (2006.01)

(52) U.S. Cl.
CPC ..... *H04L 27/2601* (2013.01); *H03H 17/0219* (2013.01); *H04L 27/2655* (2013.01); *H04L 27/2666* (2013.01); *H04L 27/2602* (2013.01)

(58) Field of Classification Search
CPC ................................................. H04L 27/2601
(Continued)

(56) References Cited

U.S. PATENT DOCUMENTS 5,507,025 A * 4/1996 Rodeffer ................ H03D 7/161
348/726
5,572,264 A * 11/1996 Mizukami ............ H04N 5/4401
348/735

(Continued)

FOREIGN PATENT DOCUMENTS

WO  WO 2017/112694  6/2017

OTHER PUBLICATIONS

Zaidi Ali A. et al., Waveform and Numerology to Support 5G Services and Requirements, IEEE Communications Magazine, Nov. 2016, pp. 90-98.
(Continued)

*Primary Examiner* — Lihong Yu
(74) *Attorney, Agent, or Firm* — The Farrell Law Firm, P.C.

(57) ABSTRACT

Apparatuses and methods of manufacturing same, systems, and methods to separate out a target numerology from a mixed numerology signal are described. In one aspect, a three mixer, two filter (3M2F) structure can separate out any one of multiple possible target numerologies. In another aspect, a sampled signal is frequency rotated such that one end of the target numerology is within one end of a passband of a first filter and a second filter, filtered by the first filter which attenuates any signal past the one end of the passband, frequency rotated again such that the opposite end of the target numerology is within the opposite end of the passband, filtered by the second filter which attenuates any signal past the opposite end of the passband, and frequency rotated a third time such that the target numerology returns to its original location in the frequency domain in the sampled signal.

10 Claims, 8 Drawing Sheets

(58) Field of Classification Search
USPC .......................................................... 375/260
See application file for complete search history.

(56) References Cited

U.S. PATENT DOCUMENTS

| | | |
|---|---|---|
| 8,594,213 B2 | 11/2013 | Sundstrom et al. |
| 9,077,603 B2 | 7/2015 | Park et al. |
| 2006/0039491 A1* | 2/2006 | Han ...................... H04L 27/266 |
| | | 375/260 |
| 2009/0176502 A1* | 7/2009 | Kuo ...................... H04W 72/14 |
| | | 455/450 |
| 2015/0180622 A1 | 6/2015 | Yoo et al. |
| 2017/0201968 A1 | 7/2017 | Nam et al. |

OTHER PUBLICATIONS

3rd Generation Partnership Project; Technical Specification Group Radio Access Network; Study on New Radio (NR) Access Technology; Physical Layer Aspects, (Release 14), 3GPP TR 38.802 V0.1.0 (Aug. 2016), 31 pages.

3rd Generation Partnership Project;Technical Specification Group Radio Access Network; Study on New Radio Access Technology, Physical Layer Aspects, (Release 14) 3GPP TR 38.802 V14.2.0 (Sep. 2017), 144 pages.

* cited by examiner

SYSTEM AND METHOD FOR PROVIDING FILTER/MIXER STRUCTURE FOR OFDM SIGNAL SEPARATION

PRIORITY

This application claims priority under 35 U.S.C. § 119(e) to U.S. Provisional Patent Application Ser. No. 62/583,260 filed on Nov. 8, 2017, the entire contents of which are incorporated herein by reference.

FIELD

The present disclosure relates generally to a communication system, and more particularly, to a filter/mixer structure for orthogonal frequency division multiplexing (OFDM) signal separation and inter carrier interference (ICI) reduction.

BACKGROUND

OFDM is a modulation format that is used in many of the latest wireless and telecommunications standards. One example of the use of OFDM is "5G" cellular. Next generation or "5G" telecommunications technology represents a giant leap forward in both requirements and resources over the current Long Term Evolution (LTE) telecommunications technology. Under the $3^{rd}$ Generation Partnership Project (3GPP), the "New Radio Access Technology," often called "NR" (new radio), is being developed as the underlying physical layer technology enabling 5G. See, e.g., Zaidi et al., *Waveform and Numerology to Support 5G Services and Requirements*, IEEE Communications Magazine (November 2016), pages 90-98; and 3GPP TSG RAN WG1 Mtg #86 Tdoc R1-168526 (Sep. 2, 2016), draft 3GPP TR 38.802, *Study of New Radio (NR) Access Technology—Physical Layer Aspects*, which are both incorporated herein by reference in their entirety.

In terms of resources, it is expected that 5G may have access to frequency bands from under 6 GHz (where the current LTE frequency bands are) up to 100 GHz. In terms of requirements, three 5G categories are often discussed:
  enhanced mobile broadband (eMBB), requiring very high data rates and large bandwidths;
  Ultra-reliable low latency communications (URLLC), requiring very low latency, and very high reliability and availability; and
  Massive machine type communications (mMTC), requiring low bandwidth, high connectivity, enhanced coverage, and low energy consumption on the user end.

One aspect of the 5G technologies is the changes to the physical layer, in which, as mentioned above, is often referred to as NR by the 3GPP. Numerology (i.e., subcarrier spacing (SCS) and waveform parameters, such as the cyclic prefix (CP)) is presently a non-issue because, in LTE, there is only one numerology in which, for example, the SCS is always 15 kHz. In a radio environment such as the current LTE environment, it is a relatively simple task for a user equipment (UE) to roughly synchronize with the signal and, based on their preset mapping in the frequency domain, find the primary synchronization signals (PSSs) and secondary synchronization signals (SSSs) in the time domain to fully synchronize.

By contrast, because of the range of 5G requirements, NR must have multiple numerologies in order to encompass the range of simultaneous usage (from relatively low bandwidth, like mMTC, to extremely high bandwidth, like 4K video on eMBB). In practice, this means, for example, there may be multiple SCSs, such as, for example, 15 kHz, 30 kHz, and 60 kHz, of different numerologies transmitting at the same time and on at least partially overlapping frequency bands.

Thus, a UE in 5G NR must be able to determine, isolate, and synchronize to more than one numerology—a new requirement for the UE.

Similar issues may arise in other communication systems where OFDM signal may be located near OFDM signals with different numerology, non-OFDM signals or OFDM signals that have the same numerology but have frequency offset of fraction of subcarrier or symbol position time offset.

All of the situations described above will give rise to intercarrier interference (ICI) into the OFDM signal.

SUMMARY

Accordingly, the present disclosure has been made to address at least the problems and/or disadvantages described herein and to provide at least the advantages described below.

According to an aspect of the present disclosure, a method is provided, including performing a first mixing on an input signal which frequency rotates the input signal such that one end of a target signal in the input signal is within one end of a passband of a first filter and a second filter in the frequency domain; performing, by the first filter, a first filtering on the first mixed input signal; performing a second mixing on the first filtered input signal which frequency rotates the first filtered input signal such that the opposite end of the target bandwidth in the frequency domain is within the opposite end of the passband; performing, by the second filter, a second filtering on the second mixed input signal; and performing a third mixing on the second filtered input signal which frequency rotates the second filtered input signal such that the target bandwidth returns to its original location in the frequency domain in the input signal.

According to an aspect of the present disclosure, a method for constructing a variable-bandwidth digital filter capable of separating one of a plurality of possible target bandwidths from a received signal is provided, including constructing a three mixer, two filter (3M2F) structure that includes a first mixer, which frequency rotates an input signal such that one end of a target bandwidth in the input signal is within one end of a passband of a first filter and a second filter in the frequency domain; the first filter which filters an output of the first mixer; a second mixer which frequency rotates an output of the first filter such that the opposite end of the target bandwidth in the frequency domain is within the opposite end of the passband; the second filter that filters an output of the second mixer; and a third mixer which frequency rotates an output of the second filter such that the target bandwidth returns to its original location in the frequency domain in the input signal. When only a single set of filter coefficients are used for both the first filter and the second filter, both the first filter and the second filter may comprise identical fixed-bandwidth filters.

According to an aspect of the present disclosure, a variable-bandwidth digital filter capable of isolating each of a plurality of receivable numerologies in a mixed numerology environment is provided, including a three mixer, two filter (3M2F) structure, that includes a first mixer which frequency rotates an input signal such that one end of a target numerology in the input signal is within one end of a passband of a first filter and a second filter in the frequency domain; the first filter which filters an output of the first mixer; a second mixer which frequency rotates an output of the first filter such that the opposite end of the target bandwidth in the frequency domain is within the opposite end of the passband; the second filter which filters an output of the second mixer; and a third mixer which frequency rotates an output of the second filter such that the target numerology returns to its original location in the input signal in the frequency domain. When only a single set of filter coefficients are used for both the first filter and the second filter, both the first filter and the second filter may comprise identical fixed-bandwidth filters.

According to an aspect of the present disclosure, an apparatus is provided, including one or more non-transitory computer-readable media; and at least one processor which, when executing instructions stored on one or more non-transitory computer readable media, performs the steps of performing a first mixing on an input signal which frequency rotates the input signal such that one end of a target bandwidth in the input signal is within one end of a passband of a first filter and a second filter in the frequency domain; performing, by the first filter, a first filtering on the first mixed input signal; performing a second mixing on the first filtered input signal which frequency rotates the first filtered input signal such that the opposite end of the target bandwidth in the frequency domain is within the opposite end of the passband; performing, by the second filter, a second filtering on the second mixed input signal; and performing a third mixing on the second filtered input signal which frequency rotates the second filtered input signal such that the target bandwidth returns to its original location in the frequency domain in the input signal.

According to an aspect of the present disclosure, a method of manufacturing a chipset, which includes at least one processor which, when executing instructions stored on one or more non-transitory computer readable media, performs the steps of performing a first mixing on an input signal which frequency rotates the input signal such that one end of a target bandwidth in the input signal is within one end of a passband of a first filter and a second filter in the frequency domain; performing, by the first filter, a first filtering on the first mixed input signal; performing a second mixing on the first filtered input signal which frequency rotates the first filtered input signal such that the opposite end of the target bandwidth in the frequency domain is within the opposite end of the passband; performing, by the second filter, a second filtering on the second mixed input signal; and performing a third mixing on the second filtered input signal which frequency rotates the second filtered input signal such that the target bandwidth returns to its original location in the frequency domain in the input signal; and the one or more non-transitory computer-readable media which store the instructions.

According to an aspect of the present disclosure, a method of testing an apparatus is provided, including testing whether the apparatus has at least one processor which, when executing instructions stored on one or more non-transitory computer readable media, performs the steps of performing a first mixing on an input signal which frequency rotates the input signal such that one end of a target bandwidth in the input signal is within one end of a passband of a first filter and a second filter in the frequency domain; performing, by the first filter, a first filtering on the first mixed input signal; performing a second mixing on the first filtered input signal which frequency rotates the first filtered input signal such that the opposite end of the target bandwidth in the frequency domain is within the opposite end of the passband; performing, by the second filter, a second filtering on the second mixed input signal; and performing a third mixing on the second filtered input signal which frequency rotates the second filtered input signal such that the target bandwidth returns to its original location in the frequency domain in the input signal; and testing whether the apparatus has the one or more non-transitory computer-readable media which store the instructions.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
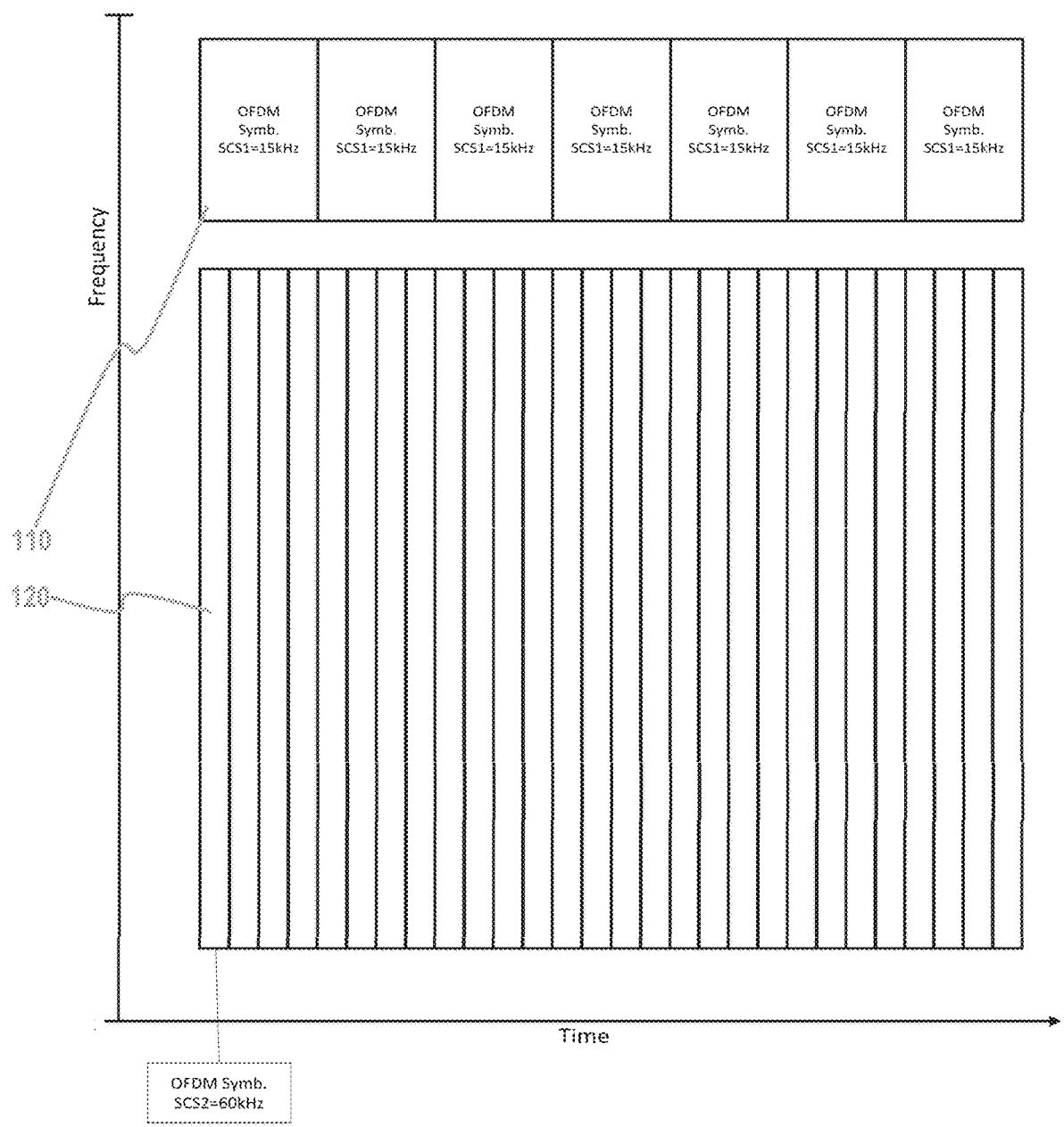
FIG. 1 illustrates an exemplary graph of frequency vs. time for two different numerologies, to which a structure according to an embodiment of the present disclosure may be applied.

Hereinafter, embodiments of the present disclosure are described in detail with reference to the accompanying drawings. It should be noted that the same elements are designated by the same reference numerals although they are shown in different drawings. In the following description, specific details such as detailed configurations and components are merely provided to assist in the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or custom. Therefore, the definitions of the terms should be determined based on the contents throughout the specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although terms including an ordinal number such as first and second may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

Various embodiments may include one or more elements. An element may include any structure arranged to perform certain operations. Although an embodiment may be described with a limited number of elements in a certain arrangement by way of example, the embodiment may include more or less elements in alternate arrangements as desired for a given implementation. It is worthy to note that any reference to "one embodiment" or "an embodiment" means that a particular feature, structure, or characteristic described in connection with the embodiment is included in at least one embodiment. The appearance of the phrase "one embodiment" (or "an embodiment") in various places in this specification does not necessarily refer to the same embodiment.

Embodiments of the present disclosure provide systems, methods, and apparatuses for filtering out one of a plurality of possible numerologies in a mixed numerology environment. Hereinafter, "numerology" may be used to signify a numerology as well as a signal of a certain numerology, as the term is commonly used among those of ordinary skill in the art. In one aspect, a variable bandwidth digital filter uses two fixed bandwidth filters and three mixers.

As mentioned above, the NR standard is currently being developed, so the channel structure for NR is not finalized yet. In the current draft 3GPP TR 38.802 (*Study of New Radio (NR) Access Technology—Physical Layer*, ver. 14.2.0 (2017 September), which is incorporated herein in its entirety), a UE has one reference numerology of 15 kHz in a given NR carrier which defines subframe duration for the given NR carrier, i.e., a subframe duration fixed to 1 ms. For a reference numerology with SCS=15 kHz, each remaining numerology has an SCS=$2^m \times 15$ kHz, where m is an integer, the subframe duration is exactly $½^m$ ms.

Although embodiments of the present disclosure are described with reference to the NR standard, the present disclosure is not limited thereto, and embodiments of the present disclosure may be implemented in any communication environment where one OFDM signal co-exists with another OFDM signal that has different SCS, frequency, or time offset, or a non-OFDM signal with small frequency separation between the two signals.

More generally, the filter/mixer structure described herein may help separate out signals and mitigate interference in a wide variety of circumstances and particularly in a system using orthogonal frequency division multiplexing (OFDM) where sampling using the fast Fourier transform (FFT) is used to recover OFDM symbols in the receiver. While the present disclosure discusses embodiments using OFDM symbols, the present disclosure is not limited thereto, but includes non-OFDM signals as well. The interference mitigated by embodiments of the present disclosure may be inter carrier interference (ICI) caused by frequency offsets and/or varying symbol lengths (such as in a mixed numerology environment), or other causes. For example, in a situation where two orthogonal frequency division multiplexed (OFDM) signals are received with identical small SCS and frequency offsets, an embodiment of the present disclosure could isolate one signal while reducing or eliminating ICI. Moreover, the present disclosure may be applied to hybrid OFDM/non-OFDM signals as well as non-OFDM signals.

FIG. 1 illustrates an exemplary graph of frequency vs. time for two different numerologies, to which a filter structure according to an embodiment of the present disclosure may be applied.

In FIG. 1, reference numeral 110 indicates a signal with a numerology having an SCS=15 kHz and reference numeral 120 indicates a signal with a numerology having an SCS=60 kHz. For the numerology 110 with SCS=15 kHz, each OFDM signal has a time duration four (4) times each OFDM signal for the numerology 120 with SCS=60 kHz. For the numerology 120 with SCS=60 kHz, each subcarrier has a frequency band four (4) times the size of each subcarrier for the numerology 110 with SCS=15 kHz. This is in accordance with the relationship above where the reference numerology has an SCS=15 kHz and the other numerology has m=2, so that SCS=$2^m \times 15$ kHz=60 kHz and the subframe duration is $½^2$ ms=¼ ms.

As discussed above, in current LTE applications, only one numerology is allowed, the subcarrier spacing is a constant (i.e., SCS=15 kHz), and the symbol duration is also a constant (an inverse of the SCS). This results in the OFDM symbols of different subcarriers maintaining orthogonality, and thus they may be decoded without experiencing inter-carrier interference (ICI).

By contrast, in 5G NR, the spectrum within a channel is partitioned between OFDM components with different SCSs and symbol durations—i.e., different numerologies. When there are transmissions with multiple numerologies, orthogonality between subcarriers of different numerologies may not be maintained. Thus, for example, when decoding the signal 110 with the numerology having SCS=15 kHz, there may be ICI from the signal 120 with the numerology having SCS=60 kHz, and vice versa. When subcarriers of different numerologies are placed with a small frequency separation between them, there will be spectral leakage between the subcarriers with different numerologies, resulting in an increase in measured error vector magnitude (EVM) and in an increase in bit error rate.

Typically, to reduce ICI while separating out one numerology from multiple possible received numerologies in a received signal, two techniques are used: windowing and filtering. In the former, a window meeting the Nyquist criteria is used to isolate the signal having the desired numerology from the received mixed numerology signal. As would be known to one of ordinary skill in the art, windows which could be used include the Hanning window, the triangular window, and many more.

When using filtering, a finite impulse response (FIR) or an infinite impulse response (IIR) filter centered on the portion of a received signal allocated to the desired numerology can be used. Whether the filter should be real or complex depends on whether the desired numerology is symmetric around the center of the baseband spectrum input to the filter. A mixed numerology system such as being considered and set under 3GPP may have variable bandwidth allocation inside a channel and the desired signal numerology inside a channel may also vary, under control of the base station, i.e., an enhanced NodeB (eNB) or an NR (next generation) NB (gNB).

Accordingly, in a mixed numerology system such as 5G NR, a large number of filters (and/or the storage of a large number of sets of filter coefficients) would be required to support all of the bandwidth allocations possible under the different numerologies. The different positions of the target numerology centers may be handled by digital down-conversion of the numerology's center to the center of the input spectrum prior to the application of filtering. However, each possible bandwidth allocation would require its own set of filter coefficients to be used in the filter, resulting in the storage requirements of a large number of sets of filter coefficients (one for each bandwidth supported) for one or more programmable filters, the resource requirements of a large number of fixed filters, or the requirements of a mixture of the two (i.e., both fixed and programmable filters). All of these resource requirements would necessarily have ripple effects as well. For example, a programmable filter would need to be reconfigured with a new set of coefficients when the desired received numerology has changed, requiring the download of the new set of coefficients from memory and loading of the new set of coefficients into the programmable filter, thereby slowing down the entire process.

As briefly mentioned above, in embodiments according to the present disclosure, the filtering necessary for mixed numerologies is performed using only a small number of sets of filter coefficients (and only a single set of filter coefficients in an embodiment discussed below), which may be hard-wired (particularly when only one set is needed) or selected via a multiplexer. When only a single set of filter coefficients is used, as with an embodiment of the present disclosure discussed below, there is no need for multiplexing of coefficients nor any need for storage of multiple sets of coefficients.

According to an embodiment of the present disclosure, a filter/mixer structure, which may be referred to herein as the three-mixers-two-filters (3M2F) structure, requires storage of only a single set of filter coefficients to be used by both filters in most practical instances. The passband provided by the single set of filter coefficients is greater than or equal to the widest possible bandwidth that may be occupied by a single numerology. However, as discussed further below, when the smallest of the possible receivable numerologies is less than a certain minimum bandwidth, different sets of filter coefficients may be required, however the total number of sets of coefficients remains small.

Figure 2:
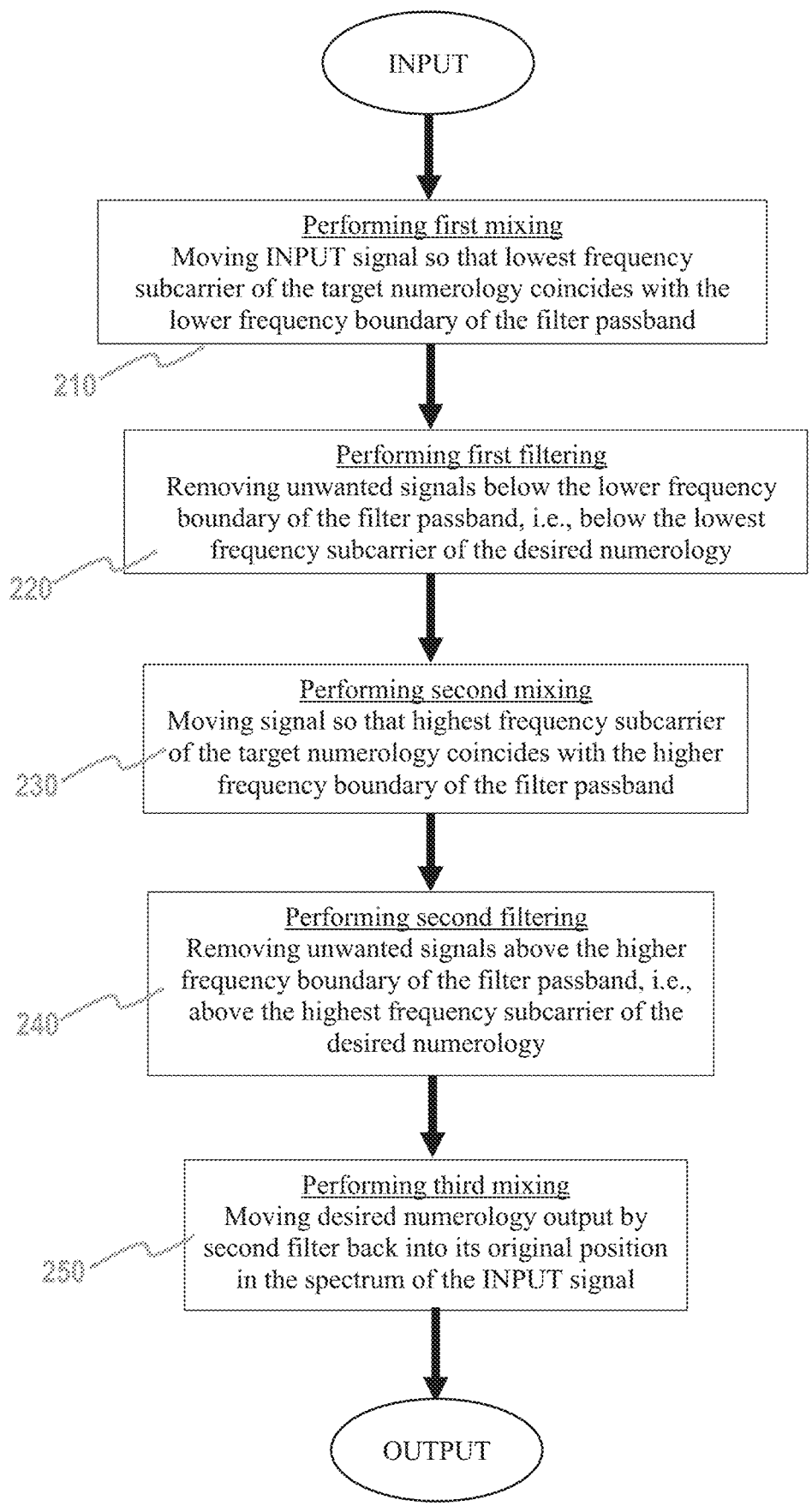
FIG. 2 illustrates an exemplary flowchart of a method for separating out a certain numerology from a mixed numerology signal, according to an embodiment of the present disclosure.

FIG. 2 illustrates an exemplary flowchart of a method for separating out a certain numerology from a mixed numerology signal, according to an embodiment of the present disclosure. This embodiment assumes a 3M2F filter/mixer structure where the two filters use the same set of filter coefficients, and the input signal spectrum ("INPUT") is assumed to have been sampled such that its center equals $f_s$, the sampling frequency, and spans, at the most, from $-f_s/2$ to $+f_s/2$. The INPUT signal has both the desired numerology and other undesired numerologies.

At 210 of FIG. 2, the first mixing is performed. The first mixer frequency rotates (or "moves" in the frequency domain) the input signal spectrum INPUT so that when the first filter is applied to the output signal of the first mixer, the lowest frequency subcarrier of the desired numerology coincides with the lower frequency passband boundary of the first filter. At 220 of FIG. 2, the first filtering is performed. Because every numerology fits within the filter passband (since the passband provided by both the first and second filter is greater than or equal to the widest possible bandwidth that may be occupied by a single numerology), after the first filter is applied, the signal remaining will constitute the desired numerology and whatever is passed through the passband from the lower frequency passband boundary up to the higher frequency passband boundary. Although the first mixing and first filtering is described at 210-220 in FIG. 2 in relation to the lowest frequency subcarrier of the numerology and the lower frequency boundary of the filter passband, this is arbitrary, and the first mixing and first filtering may be performed in relation to the highest frequency subcarrier of the numerology and the higher frequency boundary of the filter passband, as will be described in reference to 230-240 of FIG. 2.

At 230 of FIG. 2, the second mixing is performed. The second mixer moves the signal output by the first filter so that when the second filter is applied, the highest frequency subcarrier of the desired numerology coincides with the higher frequency passband boundary of the second filter. At 240 of FIG. 2, the second filtering is performed. Continuing with the same example, if the first filter cut off any of the input signal located below the lowest frequency subcarrier of the desired numerology, the second filter cuts off any of the signal spectrum above the highest frequency subcarrier of the desired numerology. Once the second filter is applied, the signal remaining will constitute only the desired numerology. However, because of the movement in the frequency domain caused by the mixers, the desired numerology after the second filter is not located at its original location in the input spectrum. Accordingly, at 250 of FIG. 2, the third mixer moves the desired numerology output by the second filter back to its original location in the input spectrum INPUT, thereby outputting an output signal ("OUTPUT") consisting of just the desired numerology.

Using methods and apparatuses according to embodiments of the present disclosure, a receiver may separate a certain numerology from a received signal containing many possible numerologies, one or more of which have different SCSs and symbol durations. The embodiment described in relation to FIG. 2 is simplified for ease of explanation; however, as discussed below and as would be understood by one of ordinary skill in the art, one or more of the filters or mixers may perform additional tasks, more than one set of filter coefficients may be used, the fixed filters in FIG. 2 may be programmable digital filters, etc., and still remain within the scope of the present disclosure.

In a 5G NR receiver, subcarriers may be transmitted with a +½ subcarrier offset to prevent direct current (DC) or 0 Hz offsets of the transmitter and the receiver from damaging DC subcarriers of the OFDM signal. The +½ subcarrier offset must be removed at the receiver. The third mixer can combine its function of restoring the original location of the target numerology with the removal of +½ subcarrier frequency offset.

As previously mentioned, the above procedure can be applied when the desired numerology bandwidth is greater than a certain minimum amount which depends upon the passband of the filters. For target numerology bandwidths smaller than this minimum, some subcarriers will survive the operation described above. Under such circumstances, 3M2F operation must be performed with a different set of coefficients, where the identical filters in the 3M2F structure are modified by using a different set of filter coefficients to form a narrower passband. In most practical applications, a second set of coefficients is unnecessary, since any surviving subcarriers are located a large distance away from the target numerology and produce only a small amount of ICI.

Figure 3:
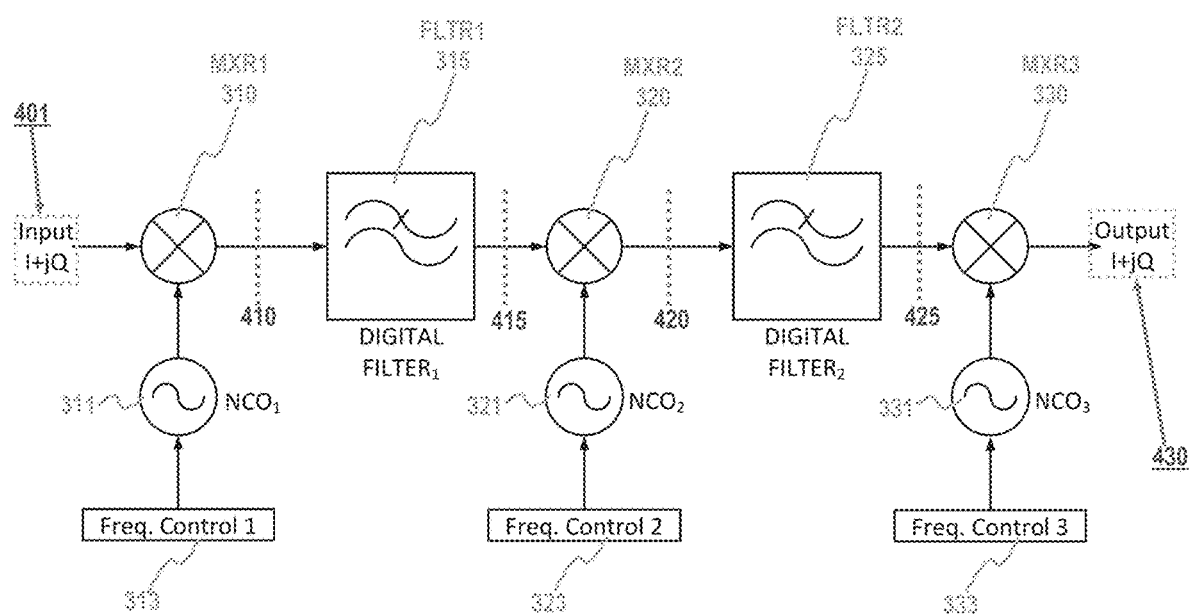
FIG. 3 illustrates an exemplary block diagram of a three mixer, two filter (3M2F) structure for separating out a certain numerology from a mixed numerology signal, according to an embodiment of the present disclosure.
Figure 4:
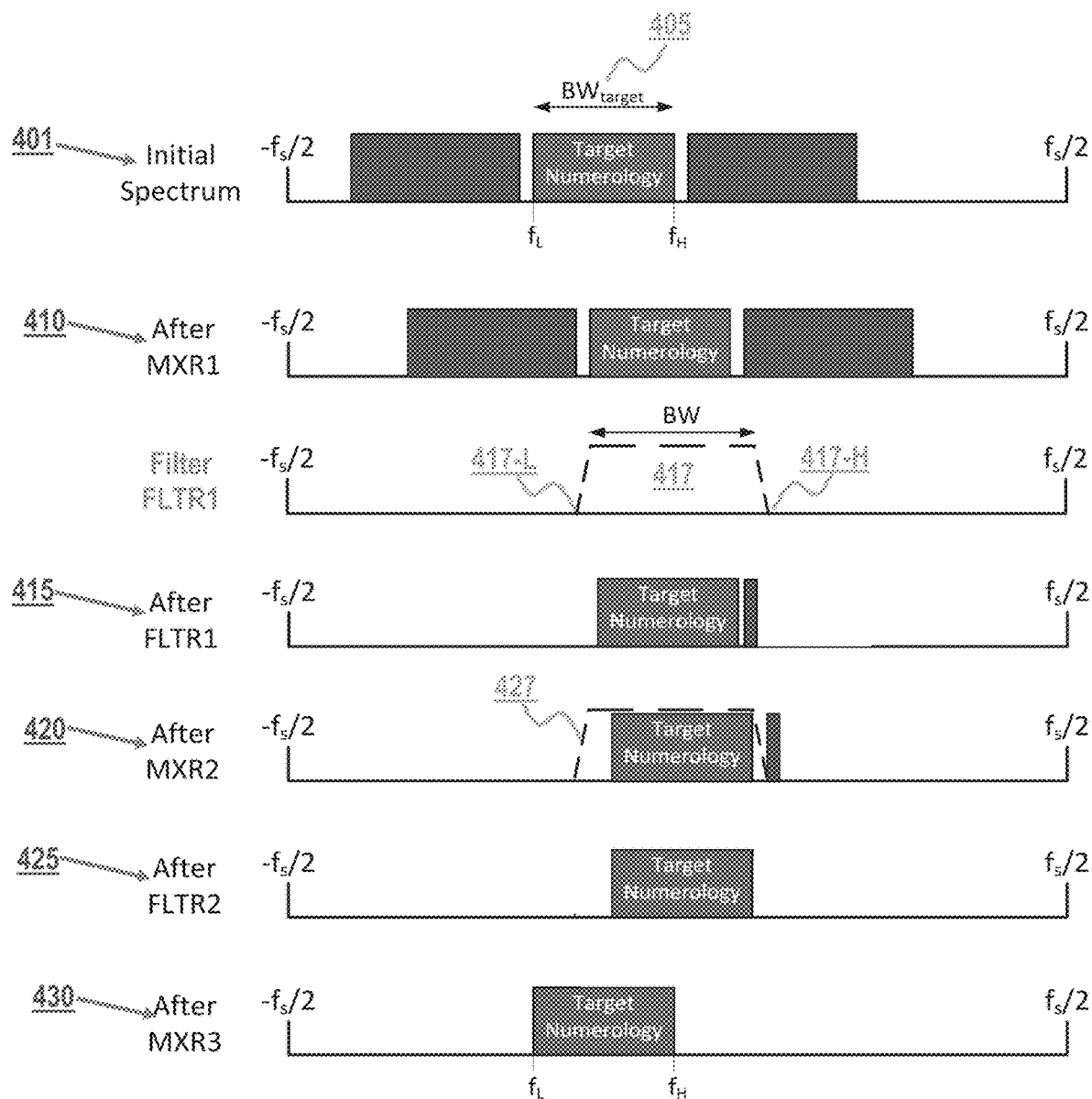
FIG. 4 illustrates exemplary graphs of a signal as it is processed by the 3M2F structure shown in FIG. 3, according to an embodiment of the present disclosure.

FIG. 3 illustrates an exemplary block diagram of a filter/mixer structure according to an embodiment of the present disclosure. FIG. 4 illustrates exemplary graphs of a signal as it is processed by the filter/mixer structure shown in FIG. 3, according to an embodiment of the present disclosure. Some of the reference numerals of FIG. 4 also appear in FIG. 3, indicating where the signal of the graph/representation indicated by the reference numeral in FIG. 4 would be located in the 3M2F filter/mixer structure of FIG. 3.

In FIG. 3, a 3M2F filter/mixer structure according to an embodiment of the present disclosure is shown, having mixers MXR1 310, MXR2 320, and MXR3 330, filters FLTR1 315 and FLTR2 325, numerically controlled oscillators (NCOs) $NCO_1$ 311, $NCO_2$ 321, and $NCO_3$ 331, generating the frequencies for mixers MXR1 310, MXR2 320, and MXR3 330, respectively, and frequency control registers Freq. Control 1 313, Freq. Control 2 323, and Freq. Control 3 333, supplying the frequency control words (FCWs) to $NCO_1$ 311, $NCO_2$ 321, and $NCO_3$ 331, respectively. The frequency control registers may be implemented in a wide variety of ways, as would be understood by one of ordinary skill in the art. For example, the FCWs may be selected from one or more lookup tables (LUTs) and input to one or more of the frequency control registers by a controller.

The 3M2F mixer/filter structure in FIG. 3 may be implemented as, for example, an integrated circuit (IC) or part of an IC.

In FIGS. 3 and 4, the input signal/initial spectrum 401 (as well as the output signal 430) is a two-sided complex signal (i.e., both signals are "I+jQ" in FIG. 3). The sampling frequency, which is applied to the input signal before being input, is represented by $f_s$, the bandwidth of each of the filters FLTR1 315 and FLTR2 325 is represented by BW 417 and 427, respectively (and would be BW/2 in a one-sided signal), and the bandwidth of the target numerology is represented by $BW_{target}$ 405, which lies between $f_L$ and $f_H$, as shown in FIG. 4. Because $f_s$ was the sampling rate, the frequency graphs in FIG. 4 run from $-f_s/2$ to $+f_s/2$, with the zero point in the center. Based on this description, Equations (1)(a) and (1)(b) below would hold true:

$$f_H - f_L \le BW \quad (1)(a)$$

$$-\frac{f_s}{2} \le f_L < f_H \le +\frac{f_s}{2} \quad (1)(b)$$

Based on these assumptions, the frequency control words for $NCO_1$ 311, $NCO_2$ 321, and $NCO_3$ 331 must generate the frequencies for mixers MXR1 310, MXR2 320, and MXR3 330, respectively, as shown in Table 1:

TABLE 1

Frequencies generated by the NCOs for the Mixers

| | Frequency of NCO generated based on input Frequency Control Word (FCW) | Comments |
|---|---|---|
| FCW → $NCO_1$ 311 → MXR1 310 | $-f_L - BW/2$ | Since $f_L$ is on the negative side of the input signal/initial spectrum 401 in FIG. 4, the result of this equation is a positive value, resulting in MXR1 310 moving the input signal/initial spectrum 401 to the right (i.e., in the positive direction) at 410. |
| FCW → $NCO_2$ 321 → MXR2 320 | $-f_H + BW/2 -$ $(-f_L - BW/2)$ or $BW + f_L - f_H$ or $BW - (f_H - f_L)$ | Since $f_L$ is on the negative side and $f_H$ is on the positive side of the input signal/initial spectrum 401, this equation becomes $BW - BW_{target}$, resulting in MXR2 320 moving signal 415 to the right (i.e., in the positive direction) at 420. |
| FCW → $NCO_3$ 331 → MXR3 330 | $f_H - BW/2$ | This equation/frequency moves signal 425 back to its original location in input signal/initial spectrum 401, as shown at 430. When necessary, $-½$ subcarrier spacing adjustment can be added here. |

As indicated in the Comments of Table 1, and mentioned further above, the third mixer (MXR3 330 in the embodiment shown in FIG. 3) can combine its function of restoring the original location of the target numerology with the removal of +½ subcarrier frequency offset. Specifically, this may be done by, for example, changing the Frequency control 3 register by an amount corresponding to frequency change of ½ SCS. In addition, $NCO_3$ phase control must be periodically reset to a proper value at the beginning of each OFDM symbol.

In FIG. 4, the input signal/initial spectrum 401 ("Initial Spectrum") is shown having both the target numerology $BW_{target}$ 405 ("Target Numerology"), lying between $f_L$ and $f_H$, and other undesirable signals, such as non-target numerologies. Moreover, the target numerology $BW_{target}$ 405 is not properly located within the input spectrum for the first filter FLTR1 315 to remove unwanted signals below the lowest frequency subcarrier of the target numerology. Accordingly, the input signal/initial spectrum 401 is input into MXR1 310 in FIG. 3, which moves the target numerology, as shown at 410 in FIG. 4, so that the lowest frequency subcarrier of the target numerology coincides with the lower frequency boundary 417-L of the filter passband 417.

The signal output by MXR1 310 at 410 is input into FLTR1 315, which has frequency passband BW 417, demarcated by lower frequency passband 417-L and higher frequency passband boundary 417-H, shown in FIG. 4. In this embodiment, FLTR1 315 is intended to remove everything in the input signal lower in frequency than the lowest frequency subcarrier in the target numerology by filtering out frequencies below lower frequency passband boundary 417-L. The frequency passband BW 417 of FLTR1 315 may also remove a portion of unwanted signal above the higher frequency passband boundary 417-H, but will not necessarily eliminate all of the unwanted signal above the highest frequency subcarrier of the target numerology, in which case the remaining undesirable signal must then be removed by the next mixer/filter stage in this 3M2F embodiment.

As shown in FIG. 4, the signal output by FLTR1 315 at 415 may still have a band of undesirable signal above the highest frequency subcarrier of the target numerology. Thus, the overall signal will need to be moved again so the next filter, FLTR2 325 having frequency passband BW 427 which is identical to the frequency passband BW 417 of FLTR1 315, can remove the remaining undesirable signal. Accordingly, the signal at 415 is input into MXR2 320 in FIG. 3, which moves the target numerology such that the highest frequency subcarrier of the target numerology coincides with the higher frequency passband boundary 417-H and the undesirable signal/noise lies outside the passband BW 427 of FLTR2 325, as shown at 420 in FIG. 4. Next, the signal output by MXR2 320 at 420 is filtered by FLTR2 325, which results in frequencies above the higher passband boundary of passband BW 427 being removed, as shown at 425 in FIG. 4. In other words, FLTR2 325 is intended to remove everything in the input signal higher in frequency than the highest frequency subcarrier of the target numerology.

As mentioned above, the order of operation may be reversed—i.e., the first mixer/first filter may remove the unwanted higher frequency signals and the second mixer/second filter could remove the unwanted lower frequency, as would be known to a person of ordinary skill in the art.

However, although the signal output by FLTR2 325 at 425 constitutes only the target numerology, the target numerology in the signal at 425 is not located at the right place in the spectrum—i.e., the target numerology is not located between $f_L$ and $f_H$ as shown in input signal/initial spectrum 401 of FIG. 4. Accordingly, MXR3 330 moves the target numerology in signal output by FLTR2 325 at 425 back to its original location in the input spectrum, as shown by signal output by MXR3 330 at 430 in FIG. 4.

Thus, according to the embodiment of the present disclosure shown in FIG. 3, a target numerology may be separated out from a signal received in a mixed numerology communication system/environment, as shown in FIG. 4.

When implementing a mixer/filter structure according to embodiments of the present disclosure, the filter bandwidth BW must be selected to accommodate all possible numerologies which may be received in the mixed numerology system. Depending on the circumstances of the particular implementation, as would be understood by one of ordinary skill in the art, another set of coefficients and/or component(s) (such as, e.g., a filter or mixer) may be needed or may be simply more suitable/appropriate. In an embodiment with more than one set of filter coefficients, the filters in the 3M2F may be programmable rather than fixed.

For example, as mentioned above, there is a certain minimum target numerology threshold below which the 3M2F filter/mixer structure in FIG. 3 may need a different set of filter coefficients. It is unlikely, however, that more than one set of filter coefficients would ever be required. In any event, if there are target numerologies below this certain minimum target numerology threshold, the first set of filter coefficients would not be sufficient to remove all unwanted signal/noise.

More specifically, Equation (2)(a) below represents the rejected bandwidth $BW_{rej}$ provided by one set of filter coefficients:

$$BW_{rej} = f_s - BW_{3M2F} \quad (2)(a)$$

where the filter bandwidth $BW_{3M2F}$ must be greater than or equal to the largest possible numerology signal, as represented by Equation (2)(b):

$$BW_{3M2F} \geq \max(BW_{target}) \quad (2)(b)$$

and the certain minimum amount filter bandwidth $BW_{min\_target}$ is represented by Equation (2)(c):

$$BW_{min\_target} = f_s - 2 \times BW_{rej} \quad (2)(c)$$

Accordingly, if the smallest possible numerology is greater than or equal to the minimum bandwidth $BW_{min\_target}$, i.e., the minimum target numerology threshold for the set of filter coefficients of the filters, only one set of coefficients is needed, and both filters may be hard-wired ("fixed") with that single set of coefficients. However, if there are one or more possible numerologies less than minimum bandwidth $BW_{min\_target}$, i.e., the minimum target numerology threshold for the set of filter coefficients, one or more additional sets of filter coefficients may be needed because otherwise undesired signal will remain. As stated above, in most practical cases, only a single set of filter coefficients would typically be required. Table 2 summarizes these two possibilities (i.e., one set of filter coefficients or more than one set of filter coefficients):

TABLE 2

| CONDITION | REQUIREMENTS/RESULTS |
|---|---|
| $\min(BW_{target}) \geq BW_{min\_target}$ or, equivalently all possible $BW_{target} \geq f_s - 2 \times BW_{rej}$ | Only single set of coefficients required. All target numerologies greater than or equal to the minimum target numerology threshold are captured by the single set of filter coefficients. All subcarriers outside the desired numerology are attenuated. Some subcarriers are double-attenuated under strict inequality. |
| $\min(BW_{target}) < BW_{min\_target}$ or, equivalently at least one possible $BW_{target} < f_s - 2 \times BW_{rej}$ | Additional set(s) of coefficients may be required. At least one target numerology is lesser than the minimum target numerology threshold for the first set of coefficients. Some subcarriers outside desired numerology survive if first set of coefficients were used. Surviving subcarriers are not immediately adjacent to the target numerology and may be ignored in most practical applications (i.e., for practical purposes the single set of coefficients may still suffice under these conditions) |

As indicated in Table 2, spectral leakage/surviving subcarriers may make another set of filter coefficients desirable in some implementations, as would be understood by one of ordinary skill in the art. A specific example is described in relation to FIGS. 5A and 5B below.

Figure 5A:
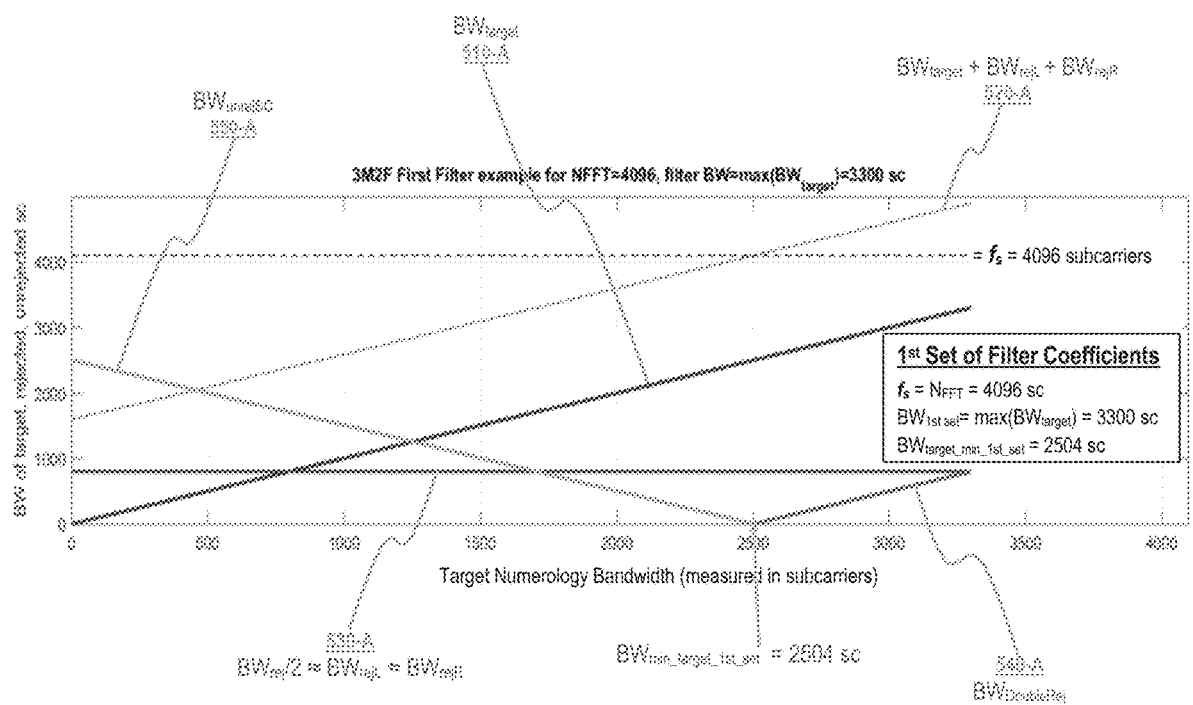
FIG. 5A illustrates a graph for signals using a first set of filter coefficients in a 3M2F structure according to an embodiment of the present disclosure.
Figure 5B:
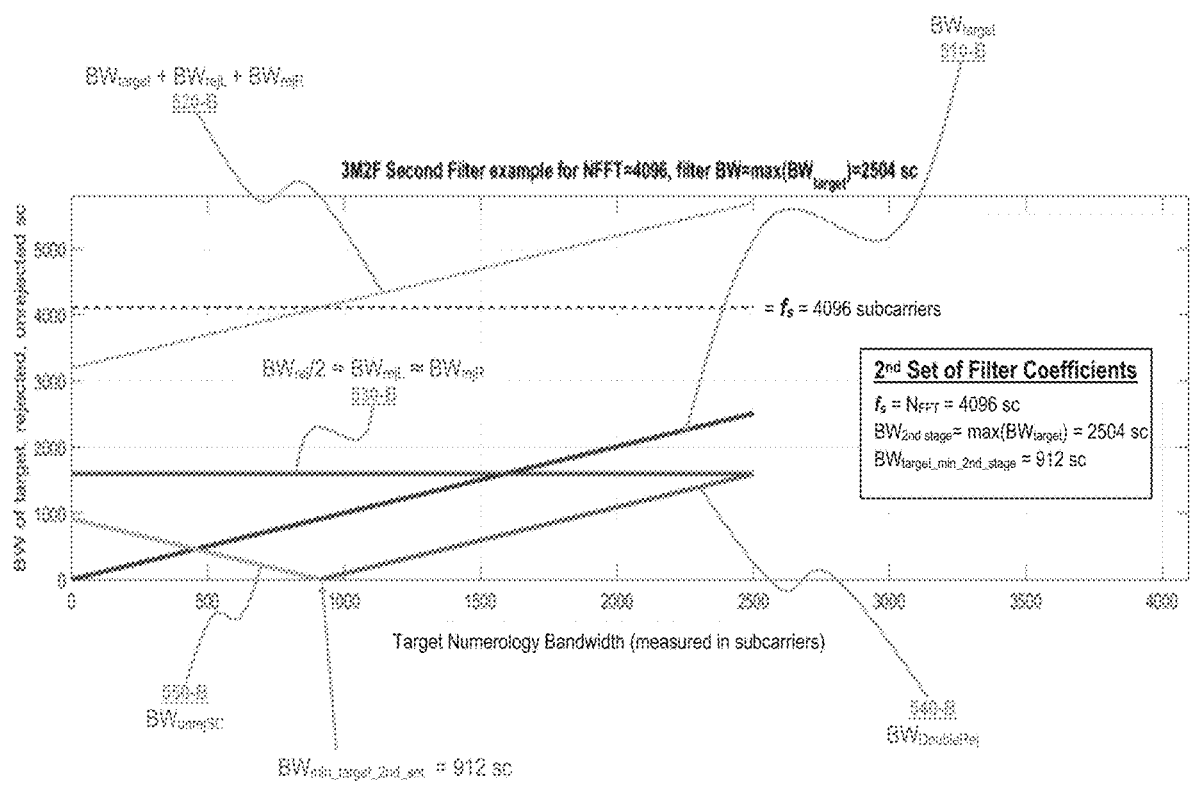
FIG. 5B illustrates a graph for signals using a second set of filter coefficients in a 3M2F structure according to the embodiment of the present disclosure of FIG. 4.

FIG. 5A illustrates a graph for signals processed in a 3M2F using a first set of coefficients, where FIG. 5B illustrates a graph of signals processed using a second set of filter coefficients, as needed, according to an embodiment of the present disclosure. In this description, bandwidth is measured in number of subcarriers (sc), thereby making the description more universally applicable. Normally, when discussing NR systems, the number of subcarriers is quantized to a Resource Block (RB) size, where RB=12 subcarriers. In the example, the following conditions are assumed for the first set of filter coefficients, corresponding to FIG. 5A:

$$f_s = 4096 \text{ subcarriers (sc)}$$

$$BW_{1st\_set} = \max(BW_{target}) = 3300 \ sc$$

$$BW_{rej\_1st\_set} = f_s - BW_{1st\_set} = 4096 - 3300 = 796 \ sc$$

$$BW_{min\_target\_1st\_set} = f_s - 2 \times BW_{rej\_1st\_set} = 2504 \ sc$$

As shown above, for FIG. 5A, the sampling frequency $f_s$ is 4096 sc; the filter bandwidth (for each filter in the 3M2F) $BW_{1st\_set}$ is 3300 sc, which is equivalent to the largest possible numerology bandwidth, and $\max(BW_{target})=3300$ sc. Thus, the minimum target bandwidth Thus, the minimum target bandwidth $BW_{min\_target}$ (i.e., the minimum target numerology threshold for the first set of filter coefficients)= 2504 sc. In FIG. 5A, there are lines indicating the $BW_{target}$ 510-A; $BW_{target}+BW_{rejL}+BW_{rejR}$ 520-A, where $BW_{rejL}$ is the rejected bandwidth on the left side, $BW_{rejR}$ is the rejected bandwidth on the right side, and $BW_{rej/2} \approx BW_{rejL} \approx BW_{rejR}$ 530-A; the double attenuated/rejected bandwidth $BW_{DoubleRej}$ 540-A; and the unrejected but attenuated bandwidth $BW_{unrejSC}$ 550-A.

Because the minimum target bandwidth $BW_{min\_target\_1st\_set}=2504$ sc (i.e., the minimum target numerology threshold) using the first set of filter coefficients, all target numerologies with a bandwidth greater than or equal to 2504 sc will be successfully captured and separated out and thus no further filtering may be required. However, some distant subcarriers of adjacent numerologies, i.e., non-target numerologies present when target numerology a bandwidth less than the minimum target numerology threshold for the first set of filter coefficients (i.e., 2504 sc), may survive the filtering operation. In FIG. 5A, the region for these non-target numerology subcarriers is indicated by line $BW_{unrejSC}$ 550-A. Since these subcarriers are some distance away from the target numerology, the EVM contribution due to spectral leakage after filtering with a 3M2F using the first set of filter coefficients will not be very high.

However, under some conditions and in certain implementations, such as if further reduction in ICI is necessary for an application, a second set of coefficients may be used, as shown in FIG. 5B. As another example, if there are desired target numerologies with a bandwidth less than 2504 sc (i.e., if there are target numerologies less than the minimum target numerology threshold), a second set of filter coefficients may be used.

If a second set of coefficients is desirable to, for example, separate out non-target numerologies with a bandwidth less than 2504 sc, the following parameters may be used for the second set of filter coefficients, as illustrated by FIG. 5B:

$$f_s = 4096 \text{ subcarriers (sc)}$$

$$BW_{2nd\_set} = \max(BW_{target\_2nd\_stage}) = 2504 \ sc$$

$$BW_{rej\_2nd\_set} = f_s - BW_{2nd\_set} = 4096 - 2504 = 1592 \ sc$$

$$BW_{min\_target\_2nd\_set} = f_s - 2 \times BW_{rej\_2nd\_set} = 912 \ sc$$

As shown above, for FIG. 5B, the sampling frequency $f_s$ is 4096 sc; the filter bandwidth (for each filter in the 3M2F) $BW_{2nd\_set}$ is 2504 sc, which was the minimum possible numerology bandwidth $BW_{min\_target\_1st\_set}$ set using the first set of filter coefficients (i.e., the minimum target numerology threshold for the first set of filter coefficients). The rejected bandwidth is broader than using the first set of filter coefficients, with $BW_{rej\_2nd\_set}=1592$ sc, and the minimum target bandwidth $BW_{min\_target\_2nd\_set}$ (i.e., the minimum target numerology threshold for the second set of filter coefficients)=912 sc. Because these subcarriers are separated from any possible target numerologies to be isolated by using the second set of filter coefficients by a wider rejection band (compared with the first set), the second set will produce less spectral leakage. However, if even the second set of filter coefficients is not sufficient to reach the desired tolerances for the particular scenario/implementation, another set, i.e., a third set of filter coefficients, may be employed in like manner to the second set of coefficients. Sets of coefficients may be added until the desired effect is achieved, although, as noted above, one set will be sufficient in most cases, and two sets of filter coefficients for most of the remaining cases.

The same lines as were shown in FIG. 5A are also shown in FIG. 5B. In FIG. 5B, there are lines indicating the $BW_{target}$ 510-B; $BW_{target}+BW_{rejL}+BW_{rejR}$ 520-B; $BW_{rej}/2 \approx BW_{rejL} \approx BW_{rejR}$ 530-B; the double attenuated/rejected bandwidth $BW_{DoubleRej}$ 540-B; and the unrejected but attenuated bandwidth $BW_{unrejSC}$ 550-B.

Figure 6:
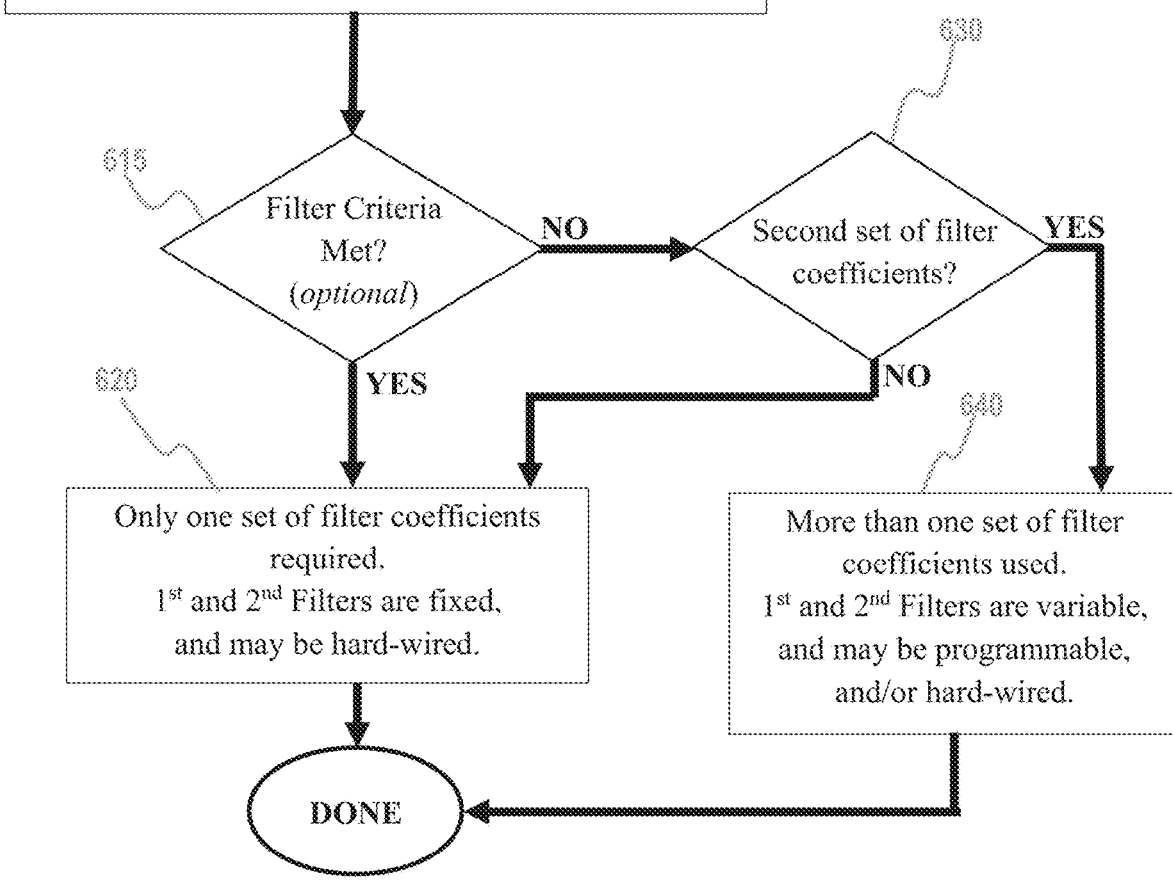
FIG. 6 illustrates an exemplary flowchart of a method for implementing a variable-bandwidth digital filter for mixed numerologies using a 3M2F structure according to an embodiment of the present disclosure.

FIG. 6 illustrates an exemplary flowchart of a method for implementing a variable-bandwidth 3M2F digital filter for mixed numerologies according to an embodiment of the present disclosure.

At 610, the 3M2F mixer/filter structure, including three mixers and two filters, is implemented in the manner shown in FIG. 3. The two filters share the same coefficients and thus have the same passband. The passband of the filters ($BW_{filter\_passband}$) must be greater than or equal to the determined largest possible numerology ($\max(BW_{target})$).

At 615, it is determined whether the criteria for the variable-bandwidth 3M2F digital filter is met, where the criteria depends on the particular scenario, implementation, communication scheme, environment, etc. For example, the criteria may be whether the minimum/smallest numerology which may be received ($\min(BW_{target})$) is greater than or equal to the minimum possible numerology which can be clearly isolated by the set of filter coefficients used by the two filters (the minimum target numerology threshold or, equivalently, $BW_{min\_target\_threshold}$)—i.e., $\min(BW_{target}) \geq BW_{min\_target\_threshold}$?. Other possible criteria include, but are not limited to, target tolerances for spectral leakage, ICI, etc., which may depend upon the specific intended scenario, implementation, communication scheme, environment, etc.

615 is optional, and, in cases where it is predetermined that a single set of filter coefficients are sufficient, 615 is not performed, but rather, at 620, only a single set of filter coefficients are used, which means the two identical filters in the 3M2F are fixed and can be hard-wired. Similarly, if it is determined that the filter criteria are met at 615, the two identical filters are fixed and can be hard-wired.

If it is determined that the filter criteria are not met at 615, it is determined whether a second set of filter coefficients should be used at 630. As stated above, in most cases, a second set of coefficients is not required, in which case the method proceeds back to 620. However, it may be determined at 630 that a second set of filter coefficients may be needed or helpful. For instance, following the filter criteria example given above, i.e., $\min(BW_{target}) \geq BW_{min\_target\_threshold}$, if the minimum/smallest numerology which may be received is less than the minimum possible numerology which can be clearly isolated using the current set of filter coefficients (min(BW$_{target}$)< BW$_{min\_target\_threshold}$ or, equivalently, the smallest numerology is less than the minimum target numerology threshold), a second set of filter coefficients may be used in order for the 3M2F to sufficiently capture the target numerology.

If it is determined to use a second set of filter coefficients at 630, more than one set of filter coefficients are used at 640, which means the two filters are still identical, but variable (i.e., using more than one set of filter coefficients), which may be implemented by having programmable filters, hard-wired filters (although much more complex than the fixed filters, of course), or filters implemented by a combination of software and hardware. For instance, still following the example above, if the smallest numerology is less than the minimum target numerology threshold for the first set of filter coefficients (min(BW$_{target}$)<BW$_{min\_target\_threshold}$) at 615, the second set of filter coefficients may be generated at 640 using the following procedure. First, the minimum target numerology threshold for the first set of filter coefficients (BW$_{min\_target\_threshold\_1st\_set}$) is used as the maximum possible target numerology (max(BW$_{target\_2nd\_set}$)) for generating the second set of filter coefficients. As a result, the passband of each of the two identical filters in the 3M2F when using the second set of filter coefficients (BW$_{filter\_passband\ 2nd\_set}$) will be greater than or equal to the largest possible numerology for the second set of filter coefficients (max(BW$_{target\_2nd\_set}$), which is also the BW$_{min\_target\_threshold\_1st\_set}$.

As stated above, normally only one or possibly two sets of coefficients would actually be needed, as shown in FIG. 6. However, the present disclosure is not limited thereto, and additional coefficient sets may be generated/implemented until the criteria of the specific variable-bandwidth digital filter is met, which, in FIG. 6, would require a loop always returning to 615 after the generation/implementation of each new set of filter coefficients.

As shown and demonstrated by the embodiments described above, one advantage of embodiments according to the present disclosure is the reduced complexity and cost. Instead of storing a large number (possibly hundreds) of sets of filter coefficients, in most practical instances, only one set is required for the two identical filters in the 3M2F structure. Furthermore, those coefficients can be hard-wired, instead of being made programmable, which further reduces the complexity of implementation of multiplexers. In such a fixed/hard-wired identical filter 3M2F variable-bandwidth digital filter embodiment, the construction would be fairly straightforward and all of the components would be relatively inexpensive.

As shown and demonstrated by the embodiments described above, one advantage of embodiments according to the present disclosure is the reduction of inter-carrier interference (ICI). A UE which separates out a signal having a certain numerology from a received signal according to an embodiment of the present disclosure also reduces ICI, which is particularly useful when in a communication system where ICI is present between closely placed channels/frequencies.

As shown and demonstrated by the embodiments described above, one advantage of embodiments according to the present disclosure is to provide a 3M2F variable-bandwidth digital filter which may be used to capture both the largest and smallest numerologies possible in a mixed numerologies communication system. Another advantage of embodiments according to the present disclosure is to provide a 3M2F variable-bandwidth digital filter which may be used to reduce ICI between closely placed channels/frequencies in a communication system.

Although embodiments of the present disclosure are described above with reference to the NR standard and mixed numerology communication environments, the present disclosure is not limited thereto, and embodiments of the present disclosure may be implemented in any communication environment where there is small SCS and/or frequency offset.

More generally, the filter/mixer structure described herein may help separate out signals and mitigate interference in a wide variety of circumstances. Specifically, a 3M2F structure according to an embodiment of the present disclosure may be used to recover OFDM symbols from an FFT sampling of a received signal. While the present disclosure discusses embodiments using OFDM symbols, the present disclosure is not limited thereto, but includes non-OFDM signals as well. The interference mitigated by embodiments of the present disclosure may be inter carrier interference (ICI) caused by frequency offsets and/or varying symbol lengths (such as in a mixed numerology environment), or other impediments. For example, in a situation where two orthogonal frequency division multiplexed (OFDM) signals are received with identical SCS and small frequency offsets, an embodiment of the present disclosure could isolate one signal while also eliminating ICI. Moreover, the present disclosure may be applied to hybrid OFDM/non-OFDM signals as well as non-OFDM signals.

Figure 7:
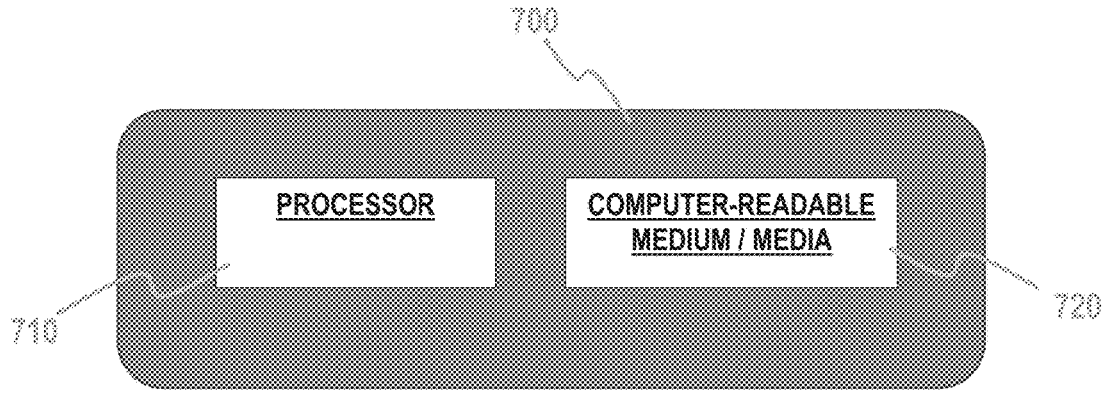
FIG. 7 illustrates an exemplary diagram of the present apparatus, according to an embodiment of the present disclosure.

FIG. 7 illustrates an exemplary diagram of the present apparatus, according to one embodiment. An apparatus 700 includes at least one processor 710 and one or more non-transitory computer readable media 720. The at least one processor 710, when executing instructions stored on the one or more non-transitory computer readable media 720, performs the steps of performing a first mixing on an input signal which frequency rotates the input signal such that one end of a target numerology in the input signal is within one end of a passband of a first filter and a second filter in the frequency domain; performing, by the first filter, a first filtering on the first mixed input signal which attenuates any signal past the one end of the passband; performing a second mixing on the first filtered input signal which frequency rotates the first filtered input signal such that the opposite end of the target numerology in the frequency domain is within the opposite end of the passband; performing, by the second filter, a second filtering on the second mixed input signal which attenuates any signal past the opposite end of the passband; and performing a third mixing on the second filtered input signal which frequency rotates the second filtered input signal such that the target numerology returns to its original location in the frequency domain in the input signal. Moreover, the one or more non-transitory computer-readable media 720 stores instructions for the at least one processor 710 to perform those steps.

Figure 8:
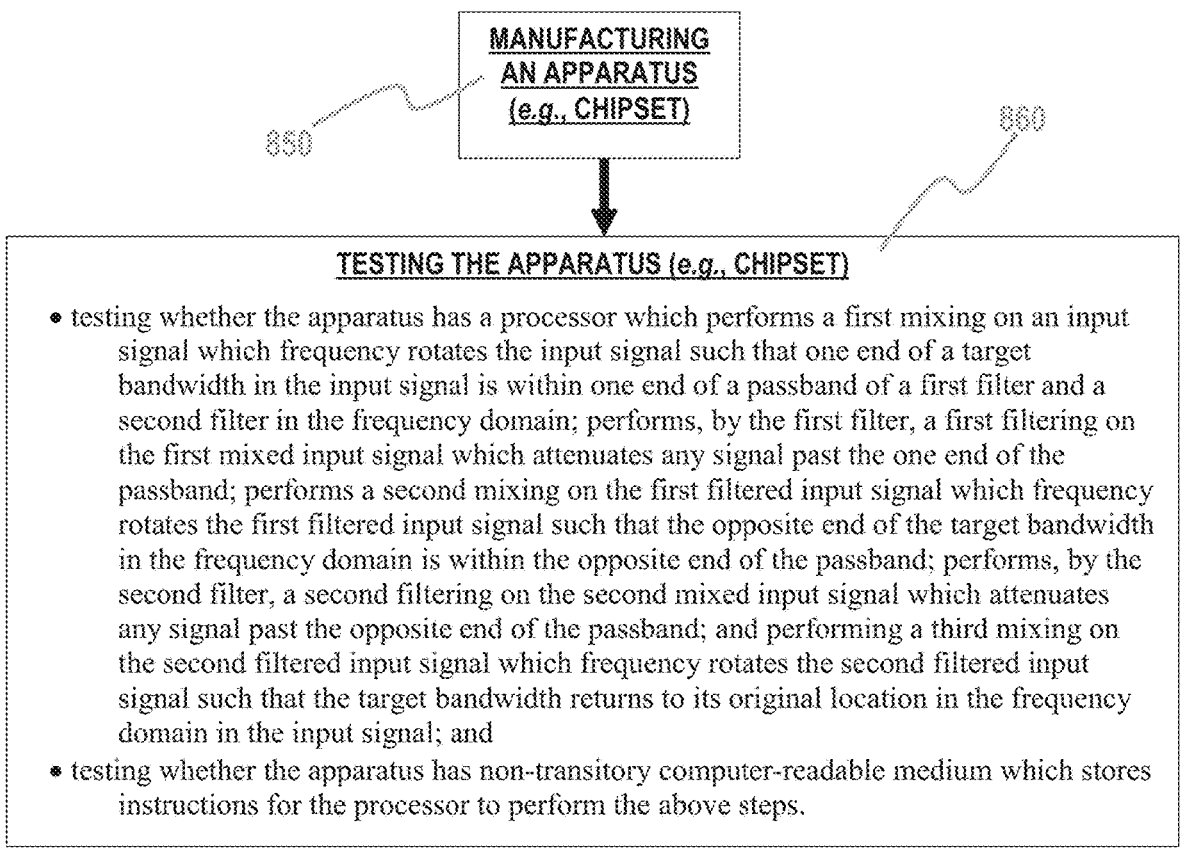
FIG. 8 illustrates an exemplary flowchart for manufacturing and testing the present apparatus, according to an embodiment of the present disclosure.

FIG. 8 illustrates an exemplary flowchart for manufacturing and testing the present apparatus, according to one embodiment.

At 850, the apparatus (for example, a chipset) is manufactured, including at least one processor and one or more non-transitory computer-readable media. When executing instructions stored on the one or more non-transitory computer readable media, the at least one processor performs the steps of performing a first mixing on an input signal which frequency rotates the input signal such that one end of a target bandwidth/numerology in the input signal is within one end of a passband of a first filter and a second filter in the frequency domain; performing, by the first filter, a first filtering on the first mixed input signal which attenuates any signal past the one end of the passband; performing a second mixing on the first filtered input signal which frequency rotates the first filtered input signal such that the opposite end of the target bandwidth/numerology in the frequency domain is within the opposite end of the passband; performing, by the second filter, a second filtering on the second mixed input signal which attenuates any signal past the opposite end of the passband; and performing a third mixing on the second filtered input signal which frequency rotates the second filtered input signal such that the target bandwidth/numerology returns to its original location in the frequency domain in the input signal. The one or more non-transitory computer-readable media store instructions for the at least one processor to perform those steps.

At 860, the apparatus (in this instance, a chipset) is tested. Testing 860 includes testing whether the apparatus has at least one processor which, when executing instructions stored on one or more non-transitory computer readable media, performs the steps of performing a first mixing on an input signal which frequency rotates the input signal such that one end of a target bandwidth in the input signal is within one end of a passband of a first filter and a second filter in the frequency domain; performing, by the first filter, a first filtering on the first mixed input signal which attenuates any signal past the one end of the passband; performing a second mixing on the first filtered input signal which frequency rotates the first filtered input signal such that the opposite end of the target bandwidth in the frequency domain is within the opposite end of the passband; performing, by the second filter, a second filtering on the second mixed input signal which attenuates any signal past the opposite end of the passband; and performing a third mixing on the second filtered input signal which frequency rotates the second filtered input signal such that the target bandwidth returns to its original location in the frequency domain in the input signal; and testing whether the apparatus has the one or more non-transitory computer-readable media which store instructions for the at least one processor to perform the above steps.

In another embodiment, a 3M2F structure capable of isolating each of a plurality of receivable numerologies in a mixed numerology environment is manufactured, where the 3M2F structure includes: a first mixer which frequency rotates an input signal such that one end of a target numerology in the input signal is within one end of a passband of a first filter and a second filter in the frequency domain; the first filter which filters an output of the first mixer to attenuate any signal past the one end of the passband; a second mixer which frequency rotates an output of the first filter such that the opposite end of the target bandwidth in the frequency domain is within the opposite end of the passband; the second filter which filters an output of the second mixer to attenuate any signal past the opposite end of the passband; and a third mixer which frequency rotates an output of the second filter such that the target numerology returns to its original location in the input signal in the frequency domain. When only a single set of filter coefficients are used for both the first filter and the second filter, both the first filter and the second filter may comprise identical fixed-bandwidth filters. When more than one set of filter coefficients are used for both the first filter and the second filter, both the first filter and the second filter may comprise identical programmable filters, hard-wired filters, or a combination of hardware and software.

In this embodiment, an apparatus may be tested to determine whether it is a 3M2F structure capable of isolating each of a plurality of receivable numerologies in a mixed numerology environment according to embodiments of the present disclosure, by testing whether the apparatus includes a first mixer which frequency rotates an input signal such that one end of a target numerology in the input signal is within one end of a passband of a first filter and a second filter in the frequency domain; the first filter which filters an output of the first mixer to attenuate any signal past the one end of the passband; a second mixer which frequency rotates an output of the first filter such that the opposite end of the target numerology in the frequency domain is within the opposite end of the passband; the second filter which filters an output of the second mixer to attenuate any signal past the opposite end of the passband; and a third mixer which frequency rotates an output of the second filter such that the target numerology returns to its original location in the input signal in the frequency domain.

The steps and/or operations described above in relation to an embodiment of the present disclosure may occur in a different order, or in parallel, or concurrently for different epochs, etc., depending on the specific embodiment and/or implementation, as would be understood by one of ordinary skill in the art. Different embodiments may perform actions in a different order or by different ways or means. As would be understood by one of ordinary skill in the art, some drawings are simplified representations of the actions performed, their descriptions herein simplified overviews, and real-world implementations would be much more complex, require more stages and/or components, and would also vary depending on the requirements of the particular implementation. Being simplified representations, these drawings do not show other required steps as these may be known and understood by one of ordinary skill in the art and may not be pertinent and/or helpful to the present description.

Similarly, some drawings are simplified block diagrams showing only pertinent components, and some of these components merely represent a function and/or operation well-known in the field, rather than an actual piece of hardware, as would be understood by one of ordinary skill in the art. In such cases, some or all of the components/modules may be implemented or provided in a variety and/or combinations of manners, such as at least partially in firmware and/or hardware, including, but not limited to one or more application-specific integrated circuits ("ASICs"), standard integrated circuits, controllers executing appropriate instructions, and including microcontrollers and/or embedded controllers, field-programmable gate arrays ("FPGAs"), complex programmable logic devices ("CPLDs"), and the like. Some or all of the system components and/or data structures may also be stored as contents (e.g., as executable or other machine-readable software instructions or structured data) on a non-transitory computer-readable medium (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques.

One or more processors, simple microcontrollers, controllers, and the like, whether alone or in a multi-processing arrangement, may be employed to execute sequences of instructions stored on non-transitory computer-readable media to implement embodiments of the present disclosure. In some embodiments, hard-wired circuitry may be used in place of or in combination with software instructions. Thus, embodiments of the present disclosure are not limited to any specific combination of hardware circuitry, firmware, and/or software.

The term "computer-readable medium" as used herein refers to any medium that stores instructions which may be provided to a processor for execution. Such a medium may take many forms, including but not limited to, non-volatile and volatile media. Common forms of non-transitory computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, or any other medium on which instructions which can be executed by a processor are stored.

Some embodiments of the present disclosure may be implemented, at least in part, on a portable device. "Portable device" and/or "mobile device" as used herein refers to any portable or movable electronic device having the capability of receiving wireless signals, including, but not limited to, multimedia players, communication devices, computing devices, navigating devices, etc. Thus, mobile devices include (but are not limited to) user equipment (UE), laptops, tablet computers, portable digital assistants (PDAs), mp3 players, handheld PCs, instant messaging devices (IMD), cellular telephones, global navigational satellite system (GNSS) receivers, watches, or any such device which can be worn and/or carried on one's person.

Various embodiments of the present disclosure may be implemented in an integrated circuit (IC), also called a microchip, silicon chip, computer chip, or just "a chip," as would be understood by one of ordinary skill in the art, in view of the present disclosure. Such an IC may be, for example, a broadband and/or baseband modem chip.

While several embodiments have been described, it will be understood that various modifications can be made without departing from the scope of the present disclosure. Thus, it will be apparent to those of ordinary skill in the art that the present disclosure is not limited to any of the embodiments described herein, but rather has a coverage defined only by the appended claims and their equivalents.

What is claimed is:

1. A method, comprising:
   (a) performing a first mixing of an input signal with a digital carrier which frequency rotates the input signal such that one end of a target bandwidth in the input signal is aligned with a corresponding edge of a passband of a first bandpass filter;
   (b) performing, by the first bandpass filter, a first filtering on the first mixed input signal;
   (c) performing a second mixing of the first filtered input signal with a digital carrier which frequency rotates the first filtered input signal such that the opposite end of the target bandwidth is aligned with a corresponding edge of a passband of a second bandpass filter;
   (d) performing, by the second bandpass filter, a second filtering on the second mixed input signal; and
   (e) performing a third mixing on the second filtered input signal which frequency rotates the second filtered input signal such that the target bandwidth returns to the target bandwidth in the input signal prior to the first mixing;
   wherein the target bandwidth comprises a target numerology, and
   wherein, when the target numerology is less than a minimum target numerology threshold for the passband of the first bandpass filter, further comprising repeating the steps starting with step (a) and using the minimum target numerology threshold as the passband for the first bandpass filter and the second bandpass filter.

2. The method of claim 1, further comprising:
   outputting the third mixed input signal as the target bandwidth.

3. The method of claim 1, wherein performing the first mixing of an input signal and performing the second mixing of the first filtered input signal each separates the target bandwidth from the input signal and reduces inter-carrier interference (ICI).

4. The method of claim 1, wherein the input signal is from a telecommunications system using at least one of orthogonal frequency division multiplex (OFDM) symbols and non-OFDM symbols.

5. The method of claim 1, wherein the input signal is from a $3^{rd}$ Generation Partnership Project (3GPP) new radio (NR) telecommunications system.

6. The method of claim 1, wherein the input signal has mixed numerologies, the target bandwidth may be any one among the mixed numerologies, and the passband of the first bandpass filter is greater than or equal to a bandwidth of a largest target numerology bandwidth which may be received.

7. The method of claim 1, wherein performing the third mixing further comprises:
   removing a ½ subcarrier frequency offset.

8. The method of claim 1, wherein the first bandpass filter and the second bandpass filter are hard-wired fixed bandwidth filters.

9. The method of claim 1, further comprising, before performing the first mixing:
   sampling a received signal with mixed numerologies to output the sampled signal as the input signal for the first mixing.

10. The method of claim 9, further comprising:
    outputting the third mixed input signal as the target numerology when the target numerology is greater than or equal to a minimum target numerology threshold for the passband of the second bandpass filter.

* * * * *